(12) United States Patent
Jain

(10) Patent No.: US 10,749,508 B1
(45) Date of Patent: Aug. 18, 2020

(54) SIGNAL CONVERTER, DUTY-CYCLE CORRECTOR, AND DIFFERENTIAL CLOCK GENERATOR

(71) Applicant: FARADAY TECHNOLOGY CORPORATION, Hsinchu (TW)

(72) Inventor: Vinod Kumar Jain, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/525,686

(22) Filed: Jul. 30, 2019

(51) Int. Cl.
*H03K 5/04* (2006.01)
*H03K 3/017* (2006.01)
*H03K 3/356* (2006.01)

(52) U.S. Cl.
CPC ......... *H03K 3/017* (2013.01); *H03K 3/35613* (2013.01)

(58) Field of Classification Search
CPC ........ H03K 5/131; H03K 5/132; H03K 5/151; H03K 7/08; H03K 5/01; H03K 5/04; H03K 5/05; H03K 5/1565; H03K 5/06; H03K 5/07; H03K 3/284; G06F 1/04; G06F 1/06; G06F 1/08; G06F 1/10; G01R 31/31922; H04L 7/0008

See application file for complete search history.

(56) References Cited

U.S. PATENT DOCUMENTS

| | | | |
|---|---|---|---|
| 6,208,186 B1 | 3/2001 | Nair | |
| 6,292,042 B1* | 9/2001 | Kim | H03K 5/151 327/257 |
| 7,119,602 B2* | 10/2006 | Davis | G06F 1/10 327/258 |
| 8,854,105 B2* | 10/2014 | Zhu | H03K 19/018521 327/333 |
| 2006/0066377 A1 | 3/2006 | Davis | |
| 2013/0188428 A1* | 7/2013 | Ma | G11C 7/1087 365/189.05 |

* cited by examiner

*Primary Examiner* — Long Nguyen
(74) *Attorney, Agent, or Firm* — Winston Hsu

(57) ABSTRACT

A signal converter, a duty-cycle corrector, and a differential clock generator are provided. The differential clock generator includes the signal converter and the duty-cycle corrector. The signal converter is capable of calibrating skew distortion, and the duty-cycle corrector is capable of calibrating duty-cycle distortion. With the signal converter and the duty-cycle corrector, the differential clock generator can be applied to communication devices operating at high frequency.

10 Claims, 5 Drawing Sheets

US 10,749,508 B1

SIGNAL CONVERTER, DUTY-CYCLE CORRECTOR, AND DIFFERENTIAL CLOCK GENERATOR

TECHNICAL FIELD

The disclosure relates in general to a signal converter, a duty-cycle corrector, and a differential clock generator, and more particularly to a signal converter, a duty-cycle corrector, and a differential clock generator capable of converting a single clock signal to a differential clock signal having minimized skew and duty-cycle distortion.

BACKGROUND

High-speed communication devices are equipped with transceivers for transmitting and receiving signals, and a serializer/de-serializer (hereinafter, SerDes) capable of converting parallel input to serial output and/or converting serial input to parallel output has been widely used in transceivers of high-speed communication devices.

FIG. 1 is a schematic diagram illustrating blocks in a multi-lanes SerDes transceiver. A multi-lanes SerDes transceiver implies that a transceiver having multiple pairs of transmitters and receivers. In FIG. 1, a 4-lines SerDes transceiver 10 is shown.

Each of the transmitters (Tx) 11 and the receivers (Rx) 13 needs a clock signal for their operations. However, providing separate clock generators at each of the transmitters 11 and receivers 13 consumes numerous space and power. Thus, a centralized clock source 15 generating a single clock signal sCLKin being collectively used by the transmitters 11 and the receivers 13 is provided. The clock source 15 can be, for example, a phase-locked loop (hereinafter, PLL) circuit.

After being generated, the single clock signal sCLKin is distributed to each of the transmitters 11 and the receivers 13. At the transmitters 11 and the receivers 13, the single clock signal sCLKin needs to be converted into a differential clock signal dCLKout.

FIG. 2 is a schematic diagram showing the differential clock generator. The differential clock generator 17 has a single input node and two differential output nodes. Through the single input node, the differential clock generator 17 receives the single clock signal sCLKin. Then, the single clock signal sCLKin is converted to two output clock signals Sout, Sout'. The differential clock signal dCLKout is defined as the difference between the output clock signals Sout, Sout'.

In FIG. 2, an exemplary pulse of the single clock signal sCLKin having a rising edge and a falling edge is used to demonstrate the operation of the differential clock generator. In the specification, transitions of the output clock signal Sout and those of the single clock signal sCLKin are assumed to be consistent. On the other hand, transitions of the output clock signal Sout' and those of the single clock signal sCLKin are assumed to be opposite.

Ideally, the rising edge of the output clock signal Sout is aligned with the falling edge of the output clock signal Sout', and the falling edge of the output clock signal Sout is aligned with the rising edge of the output clock signal Sout'. However, for a conventional differential clock generator, such alignment relationship can barely be achieved because of the following reasons.

As mentioned above, each of the transmitters 11 and the receivers 13 needs to be equipped with a differential clock generator. However, when the number of transmitters 11 and the receivers 13 increases, the distances d1, d2 between the clock source 15 and the transmitters 11 and the receivers 13 become longer. For example, the distances d1, d2 might be longer than 1 mm for a 4-lanes SerDes transceiver.

After being transmitted for the distances d1, d2, the quality of single clock signal sCLKin can be seriously affected. Consequentially, the operation of the differential clock generator 17 is influenced, and precisions of the output clock signals Sout, Sout' degrade. Furthermore, a variation of the process, voltage, and temperature (hereinafter, PVT) parameters may bring side effects to the differential clock generator 17 so that precisions of the output clock signals Sout, Sout' are affected. Thus, undesired characters of the output clock signals Sout, Sout', such as skew and the duty-cycle distortion, might occur.

For the high frequency application, the cycle of the single clock signal sCLKin is relatively short and tolerance margin of the output clock signals Sout, Sout' becomes more limited. Therefore, the capability of ensuring precisions of the output clock signals Sout, Sout' becomes a critical issue, especially for the SerDes transceiver targeting to the high-frequency application.

SUMMARY

The disclosure is directed to a signal converter, a duty-cycle corrector, and a differential clock generator. The differential clock generator includes the signal converter capable of minimizing skew distortion and the duty-cycle corrector capable of minimizing duty-cycle distortion.

According to one embodiment, a signal converter is provided. The signal converter converts a single input signal to a first differential converted signal and a second differential converted signal. The signal converter includes a transmission gate, a preliminary inverter, and a skew-calibration circuit. The transmission gate receives and delays the single input signal (Sin) to generate a delayed input signal. The preliminary inverter receives and inverts the single input signal (Sin) to generate an inverted input signal. The skew-calibration circuit includes a first input node, a second input node, a first output node, a second output node, a first and a second skew-calibration inverters, and a first and a second skew-calibration buffers. Being electrically connected to the transmission gate, the first input node receives the delayed input signal. Being electrically connected to the preliminary inverter, the second input node receives the inverted input signal. The first output node and the second output node output the first differential converted signal and the second differential converted signal, respectively. Being electrically connected to the first input node and the first output node, the first skew-calibration inverter inverts the delayed input signal. Being electrically connected to the second input node and the first output node, the first skew-calibration buffer buffs the inverted input signal. The first skew-calibration inverter and the first skew-calibration buffer jointly generate the first differential converted signal. Being electrically connected to the second input node and the second output node, the second skew-calibration inverter inverts the inverted input signal. Being electrically connected to the first input node and the second output node, the second skew-calibration buffer buffs the delayed input signal. The second skew-calibration inverter and the second skew-calibration buffer jointly generate a second differential converted signal at the second output node. The first differential converted signal and the second differential converted signal are out of phase.

According to another embodiment, a duty-cycle corrector is provided. The duty-cycle corrector includes a first input node for receiving a first corrector input signal, a second input node for receiving a second corrector input signal, a first output node for outputting a first cycle-corrected output signal, a second output node for outputting a second cycle-corrected output signal, an upper signal path, a lower signal path, a first resistor, a second resistor and a replica inverter. The upper signal path includes a first capacitor and a first corrector inverter. The first capacitor is electrically connected to the first input node and a first mediate node. The first capacitor filters a DC component of the first corrector input signal to generate a first mediate signal at the first mediate node. The first corrector inverter is electrically connected to the first mediate node and the first output node. The first corrector inverter inverts the first mediate signal to generate the first cycle-corrected output signal. The lower signal path includes a second capacitor and a second corrector inverter. The second capacitor is electrically connected to the second input node and a second mediate node. The second capacitor filters a DC component of the second corrector input signal to generate a second mediate signal at the second mediate node. The second corrector inverter is electrically connected to the second mediate node and the second output node. The second corrector inverter inverts the second mediate signal to generate the second cycle-corrected output signal. The first resistor is electrically connected to the first mediate node and a bias node. The second resistor is electrically connected to the second mediate node and the bias node. The replica inverter is electrically connected to the bias node. The replica inverter generates a bias signal at the bias node, and the bias signal is equivalent to an average of the first mediate signal and the second mediate signal.

According to an alternative embodiment, a differential clock generator is provided. The differential clock generator includes the signal converter and the duty-cycle corrector.

Figure 1:
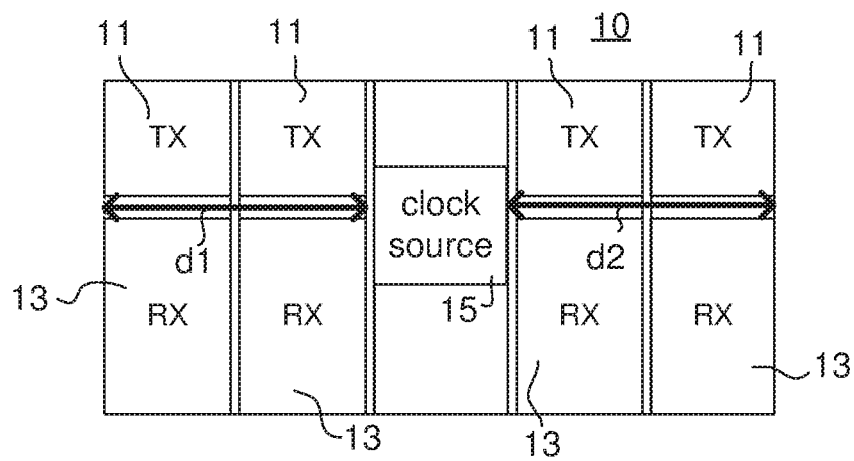
FIG. 1 (prior art) is a schematic diagram illustrating blocks in a multi-lanes SerDes transceiver.
Figure 2:
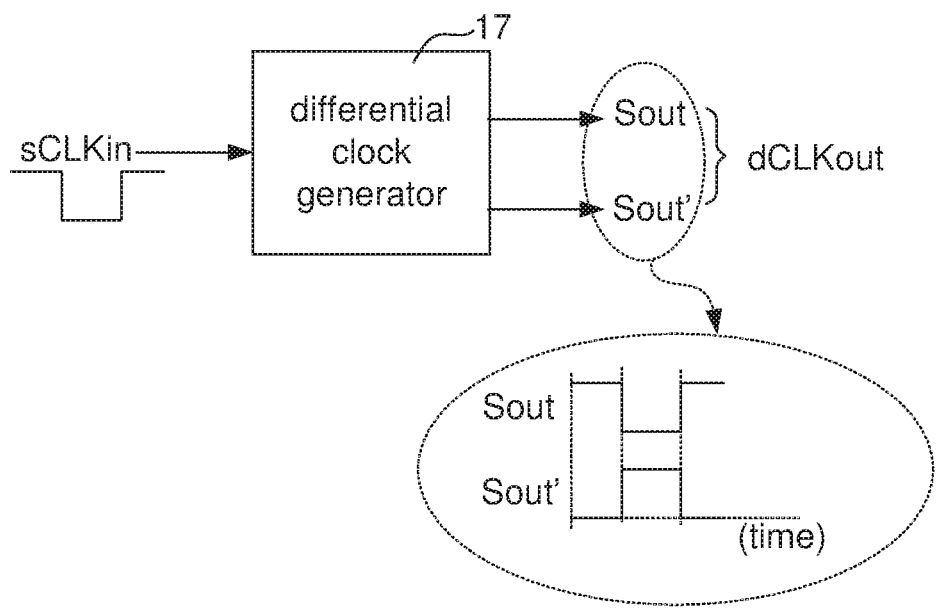
FIG. 2 (prior art) is a schematic diagram showing the differential clock generator.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 3:
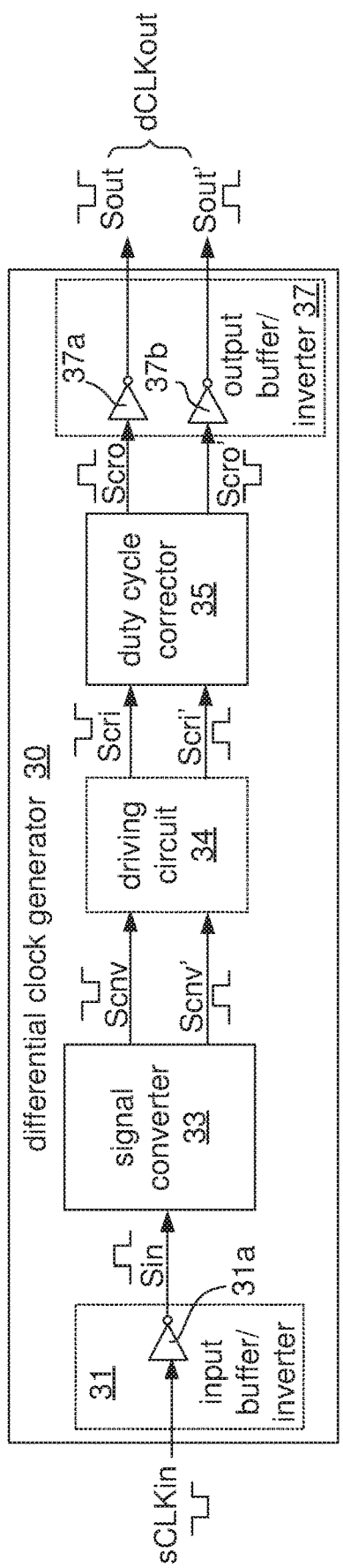
FIG. 3 is a schematic block diagram illustrating blocks of the differential clock generator according to the embodiment of the present disclosure.

FIG. 3 is a schematic block diagram illustrating blocks of the differential clock generator according to the embodiment of the present disclosure. The differential clock generator 30 includes an input buffer/inverter 31, a (single-to-differential) signal converter 33, a duty-cycle corrector 35, and an output buffer/inverter 37. In the specification, the signal converter 33 is capable of calibrating skew distortion, and the duty-cycle corrector 35 is capable of calibrating duty-cycle distortion. With the functions of calibrating the skew and the duty-cycle distortion, the output clock signals Sout, Sout' are out of phase and duty cycles of the output clock signals Sout, Sout' are equivalent to 50%.

The input buffer/inverter 31 includes at least one inverter 31a, and the output buffer/inverter 37 includes inverters 37a, 37b. The input buffer/inverter 31 receives and buffers/inverts the single clock signal sCLKin. Then, a single input signal Sin is generated. Both the clock signal and the single input signal Sin are single-ended. Then, the signal converter 33 converts the single input signal Sin to a pair of differential signals, that is, the differential converted signals Scnv, Scnv'.

A driving circuit 34 can be selectively adapted to enhance driving abilities of the output clock signals Sout, Sout'. The driving circuit 34 receives the differential converted signals Scnv, Scnv', and generates corrector input signals Scri, Scri'. Then, the duty-cycle corrector 35 generates cycle-corrected output signals Scro, Scro' based on the corrector input signals Scri, Scri'. In a case that the driving circuit 34 is not used, the duty-cycle corrector 35 directly receives the differential converted signals Scnv, Scnv' as the corrector input signals Scri, Scri'.

The cycle-corrected output signals Scro, Scro' are further transmitted to the output buffer/inverter 37. Then, the inverters 37a, 37b in the output buffer/inverter 37 respectively buffer/invert the cycle-corrected output signals Scro, Scro' to generate the output clock signal Sout, Sout'. An upper signal path and a lower signal path are shown in FIG. 3. Details about the upper signal path and the lower signal path will be illustrated later.

Figure 4:
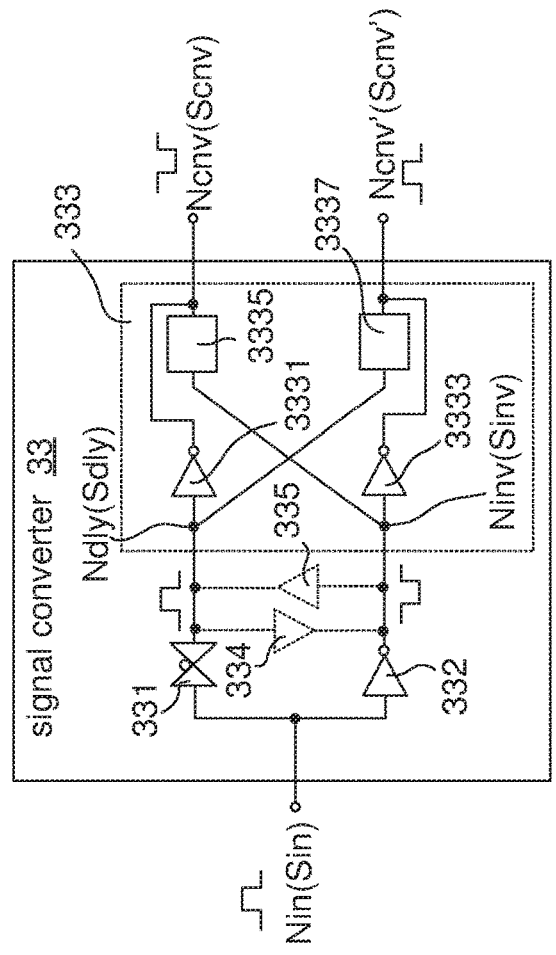
FIG. 4 is a schematic diagram illustrating the signal converter according to the embodiment of the present disclosure.

FIG. 4 is a schematic diagram illustrating the signal converter according to the embodiment of the present disclosure. The signal converter 33 includes an input node Nin, two output nodes Ncnv, Ncnv', a transmission gate 331, a preliminary inverter 332, a pair of cross-coupled inverters 334, 335, and a skew-calibration circuit 333.

Both the transmission gate 331 and the preliminary inverter 332 continually receive the single input signal Sin through the input node Nin. Then, the always-on transmission gate 331 delays the single input signal Sin to generate a delayed input signal Sdly. Alternatively speaking, the single input signal Sin is propagated by the transmission gate 331. Thus, the transitions of the delayed input signal Sdly are consistent with transitions of the single input signal Sin. On the other hand, the preliminary inverter 332 inverts the single input signal Sin to generate an inverted input signal Sinv. The transitions of the inverted input signal Sinv are opposite to transitions of the single input signal Sin.

In an ideal case, the transition speeds of the transmission gate 331 and the preliminary inverter 332 are equal, and this implies that a rising transition of the delayed input signal Sdly is expected to be aligned with a falling transition of the inverted input signal Sinv, and vice versa. However, delay of the transmission gate 331 and the preliminary inverter 332 are not matched, especially when the PVT condition varies.

For the sake of illustration, the rising edge of the delayed input signal Sdly is assumed to lead the falling edge of the inverted input signal Sinv in the specification. Whereas, in practical application, the rising edge of the delayed input signal Sdly might lead or lag the falling edge of the inverted input signal Sinv.

The skew-calibration circuit 333 includes input nodes Ndly, Ninv, output nodes, skew-calibration inverters 3331, 3333, and skew-calibration buffers 3335, 3337. The input nodes Ndly, Ninv are respectively electrically connected to the output of the transmission gate 331 and the output of the preliminary inverter 332. Optionally, the cross-coupled inverters 334, 335 can be electrically connected to the input nodes Ndly, Ninv. The cross-coupled inverter 334 inverts the delayed input signal Sdly and drives the inverted input signal Sinv. The crossed-coupled inverter 335 inverts the inverted input signal Sinv and drives the delayed input signal Sdly.

The signals generated at the output nodes of the skew-calibration circuit 333 are directly considered as the differential converted signals Scnv, Scnv'. The skew-calibration inverter 3331 and the skew-calibration buffer 3335 belong to the upper signal path, and the skew-calibration inverter 3333 and the skew-calibration 3337 belong to the lower signal path.

Both the skew-calibration inverter 3331 and the skew-calibration buffer 3337 receive the delayed input signal Sdly. Alternatively speaking, the skew-calibration inverter 3331 at the upper signal path and the skew-calibration buffer 3337 at the lower signal path receive their inputs from the transmission gate 3331. Both the inverter 3333 and the skew-calibration buffer 3335 receive the inverted input signal Sinv. Alternatively speaking, the skew-calibration inverter 3333 at the lower signal path and the skew-calibration buffer 3335 at the upper signal path receive their inputs from the preliminary inverter 3332.

The skew-calibration inverter 3331 inverts the delayed input signal Sdly, and the skew-calibration buffer 3335 buffs the inverted input signal Sinv. As the outputs of the skew-calibration inverter 3331 and the skew-calibration buffer 3335 are electrically connected to the output node Ncnv, the output of the skew-calibration inverter 3331 and the output of the skew-calibration buffer 3335 are combined and jointly generate the differential converted signal Scnv. The transitions of the differential converted signal Scnv are opposite to the transitions of delayed input signal Sdly and the transitions of single input signal Sin.

The skew-calibration inverter 3333 inverts the inverted input signal Sinv, and the skew-calibration buffer 3337 buffs the delayed input signal Sdly. As the outputs of the skew-calibration inverter 3333 and the skew-calibration buffer 3337 are electrically connected to the output node Ncnv', the output of the skew-calibration inverter 3333 and the output of the skew-calibration buffer 3337 are combined and jointly generate the differential converted signal Scnv'. The transitions of the differential converted signal Scnv' are opposite to the transitions of inverted input signal Sinv but consistent with transitions of single input signal Sin.

Figure 5A:
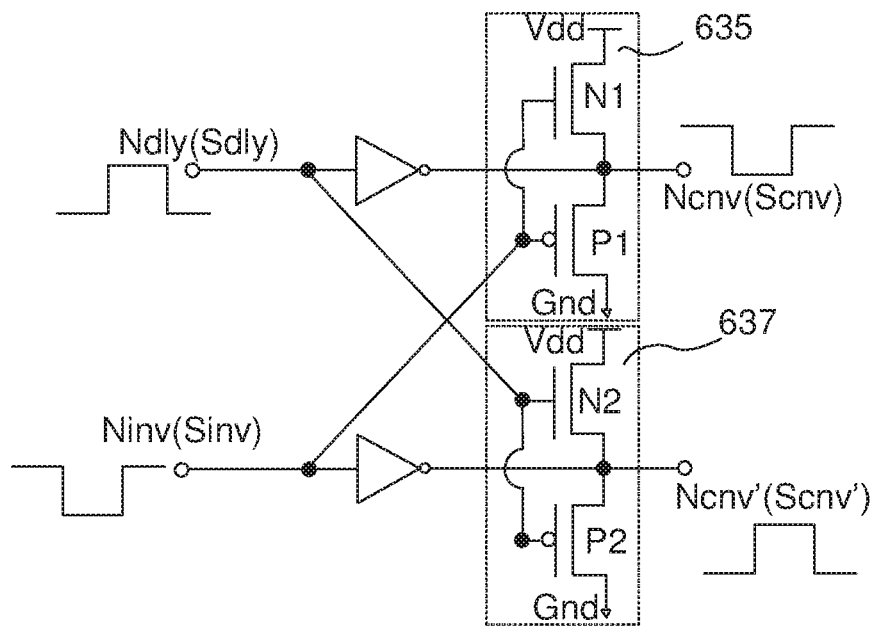
FIGS. 5A and 5B are schematic diagrams showing different implementations of the skew-calibration buffers.
Figure 5B:
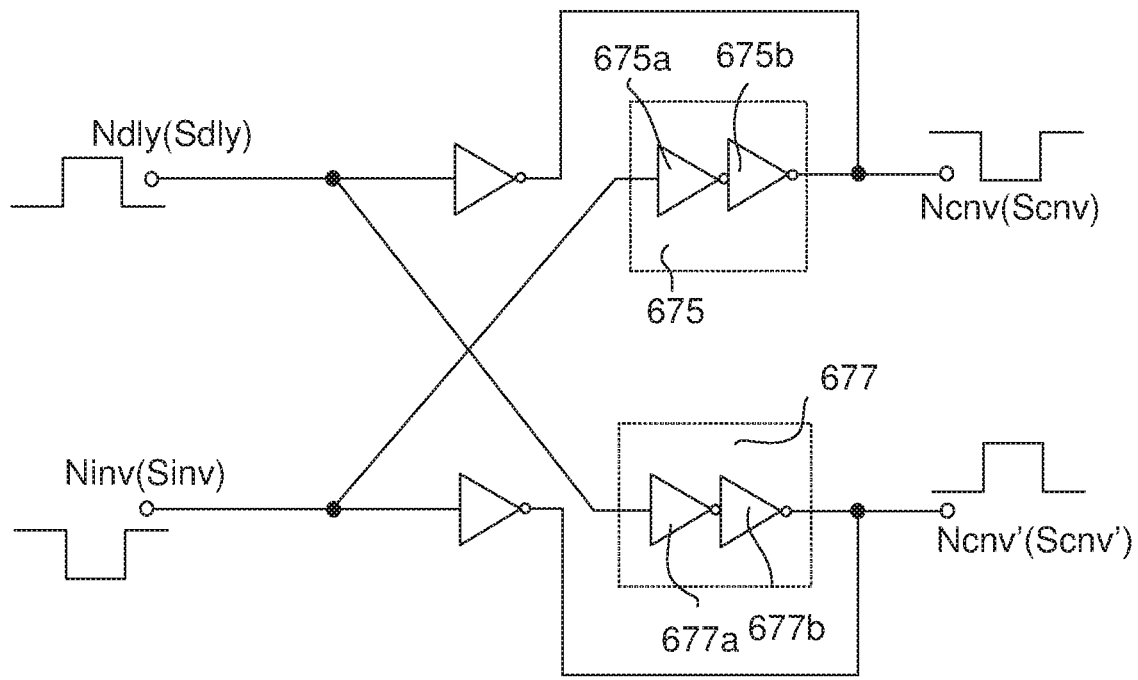

Because of the symmetry of the upper signal path and the lower signal path, the performance of the skew-calibration circuit 333 tracks well over a large range of PVT parameters. FIGS. 5A and 5B are schematic diagrams showing different implementations of the skew-calibration buffers 3335, 3337.

In FIG. 5A, each of the skew-calibration buffers 635, 637 are implemented with an NMOS-PMOS pair. In the skew-calibration buffer 635, the NMOS transistor N1 and the PMOS transistor P1 jointly determine the differential converted signal Scnv. The NMOS transistor N1 is electrically connected to a supply voltage Vdd, the input node Ninv, and the output node Ncnv, and the PMOS transistor P1 is electrically connected to a ground voltage Gnd, the input node Ninv, and the output node Ncnv. The NMOS transistor N1 selectively pulls up the differential converted signal Scnv, and the PMOS transistor P1 selectively pulls down the differential converted signal Scnv. In the skew-calibration buffer 637, the NMOS transistor N2 and the PMOS transistor P2 jointly determine the differential converted signal Scnv'. The NMOS transistor N2 is electrically connected to the supply voltage Vdd, the input node Ndly, and the output node Ncnv', and the PMOS transistor P2 is electrically connected to the ground voltage Gnd, the input node Ndly, and the output node Ncnv'. The NMOS transistor N2 selectively pulls up the differential converted signal Scnv', and the PMOS transistor P2 selectively pulls down the differential converted signal Scnv'.

When the delayed input signal Sdly transits from a logic low to a logic high, the inverted input signal (Sinv) transits from a logic high to a logic low. Meanwhile, in the skew-calibration buffer 635, the NMOS transistor N1 is turned off, and the PMOS transistor P1 is turned on. Conduction of the PMOS transistor P1 thus pulls down the differential converted signal Scnv to the ground voltage Gnd (logic low). Moreover, in the skew-calibration buffer 637, the NMOS transistor N2 is turned on, and the PMOS transistor P2 is turned off. Conduction of the NMOS transistor N2 thus pulls up the differential converted signal Scnv' to the supply voltage Vdd (logic high).

When the delayed input signal (Sdly) transits from a logic high to a logic low, the inverted input signal (Sinv) transits from a logic low to a logic high. Meanwhile, in the skew-calibration buffer 635, the NMOS transistor N1 is turned on, and the PMOS transistor P1 is turned off. Conduction of the NMOS transistor N1 thus pulls up the differential converted signal Scnv to the supply voltage Vdd (logic high). Moreover, in the skew-calibration buffer 637, the NMOS transistor N2 is turned off, and the PMOS transistor P2 is turned on. Conduction of the PMOS transistor P2 thus pulls down the differential converted signal Scnv' to the ground voltage Gnd (logic low).

In FIG. 5B, each of the skew-calibration buffers 675, 677 includes two buffering inverters 675a, 675b, 677a, 677b. In the skew-calibration buffer 675, the buffering inverter 675a is electrically connected to the input node Ninv, and the buffering inverter 675b is electrically connected to the buffering inverter 675a and the output node Ncnv. In the skew-calibration buffer 677, the buffering inverter 677a is electrically connected to the input node Ndly, and the buffering inverter 677b is electrically connected to the buffering inverter 677a and the output node Ncnv'.

Figure 6:
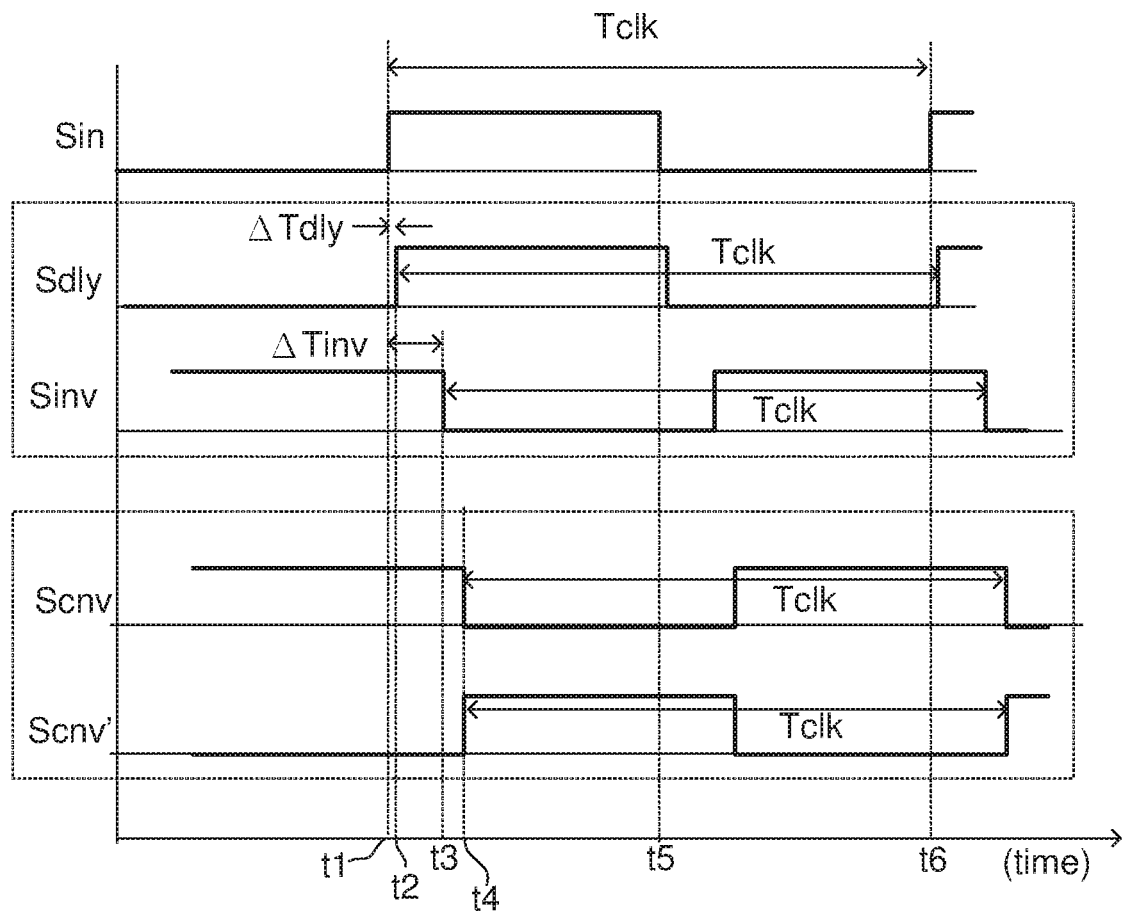
FIG. 6 is a waveform diagram illustrating signals related to the signal converter according to the embodiment of the present disclosure.

FIG. 6 is a waveform diagram illustrating signals related to the signal converter according to the embodiment of the present disclosure. The vertical axis represents voltages (amplitude) of different signals. The horizontal axis represents time. The first waveform represents the single input signal Sin, and the other waveforms are classified with two dotted rectangles. The first dotted rectangle circulates the delayed input signal Sdly and the inverted input signal Sinv, and the second dotted rectangle circulates the differential converted signals Scnv1, Scnv2.

Please refer to FIGS. 4 and 6 together. At the input node Nin of the signal converter 33, the single input signal Sin rises at the time point t1. The transmission gate 331 brings some delay to generate the delayed input signal Sdly, and the inverter 432b brings some other delay to generate the inverted input signal Sinv. Thus, a time difference ΔTdly, representing delay caused by the transmission gate 331, exists between the rising edges of single input signal Sin and the delayed input signal Sdly. Similarly, another time difference ΔTinv, representing delay caused by the preliminary inverter 332, exists between the rising edge of single input signal Sin and the falling edge of the inverted input signal Sinv. In FIG. 6, the rising edge of the delayed input signal Sdly is assumed to lead the falling edge of the inverted input signal Sinv. Nevertheless, the rising edge of the delayed input signal Sdly might lag the falling edge of the inverted input signal Sinv.

When the cross-coupled inverters 334, 335 are used, the time difference between the time point t2 and the time point t3 can be decreased. That is, the time point that the delayed input signal Sdly rises becomes more close to the time point that the inverted input signal Sinv falls.

After receiving the delayed input signal Sdly and the inverted input signal Sinv, the skew-calibration circuit 333 generates the differential converted signals Scnv, Scnv' at the time point t4. As each of the upper signal path and the lower signal path includes a skew-calibration inverter, transition directions of the differential converted signals Scnv, Scnv' are opposite to transition directions of the delayed input signal Sdly and the inverted input signal Sinv. That is, the differential converted signal Scnv falls in response to the rising of the delayed input signal Sdly, and the differential converted signal Scnv' rises in response to the falling of the inverted input signal Sinv.

According to the embodiment shown in FIG. 4, the differential converted signal Scnv is jointly generated by the skew-calibration inverter 3331 and the skew-calibration buffer 3335 at the upper signal path. The skew-calibration inverter 3331 and the skew-calibration buffer 3335 respectively receive the delayed input signal Sdly and the inverted input signal Sinv as their inputs. This implies that the generation of the differential converted signal Scnv is dominated by both the delayed input signal Sdly and the inverted input signal Sinv. Similarly, in FIG. 4, the differential converted signal Scnv' is jointly generated by the skew-calibration inverter 3333 and the skew-calibration buffer 3337 at the lower signal path. The skew-calibration inverter 3333 and the skew-calibration buffer 3337 respectively receive the inverted input signal Sinv and the delayed input signal Sdly as their inputs. This implies that the generation of the differential converted signal Scnv' is dominated by both the inverted input signal Sinv and the delayed input signal Sdly.

Generations of both the differential converted signals Scnv, Scnv' are both based on the delayed input signal Sdly and the inverted input signal Sinv. Therefore, the differential converted signals Scnv, Scnv' transit simultaneously (for example, time point t4), although transition directions of the differential converted signals Scnv, Scnv' are opposite.

In FIG. 6, the duration between the time point t1 and the time point t6 represents the cycle of the single input signal Sin (that is, Tclk). Similarly, cycles of the delayed input signal Sdly, the inverted input signal Sinv, and the differential converted signals Scnv, Scnv' are equivalent to Tclk. The duty cycle of the single input signal Sin can be obtained by calculating the ratio of the duration between the time point t1 and the time point t5 and the duration between the time point t1 and the time point t6. In an ideal case, the duty-cycles of the differential converted signals Scnv, Scnv' are equivalent to 50%. However, as there might be chances causing duty-cycle distortion, the duty-cycles of the differential converted signals Scnv, Scnv' might not be equivalent to 50%. Therefore, the duty-cycle corrector is adapted to solve such an issue.

Figure 7:
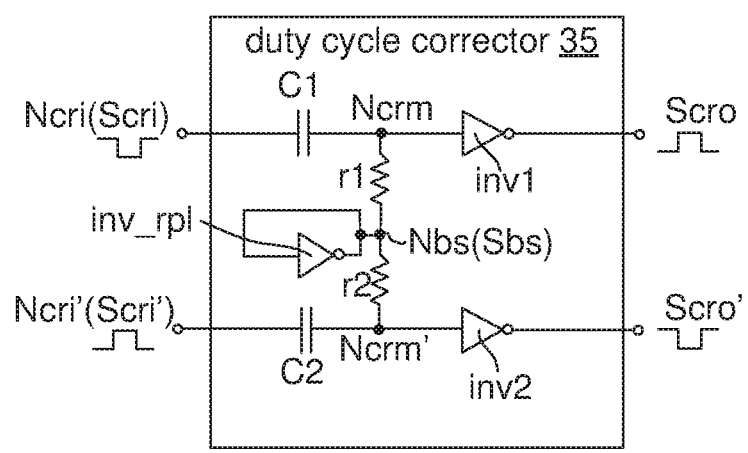
FIG. 7 is a schematic diagram illustrating the duty-cycle corrector according to the embodiment of the present disclosure.

FIG. 7 is a schematic diagram illustrating the duty-cycle corrector according to the embodiment of the present disclosure. The duty-cycle corrector 35 includes capacitors C1, C2, (bias) resistors r1, r2, corrector inverters inv1, inv2, and a replica inverter inv_rpl. The capacitor C1, the resistor r1, and the input of the inverter inv1 are jointly electrically connected to a mediate node Ncrm. The capacitor C2, the resistor r2, and the input of the corrector inverter inv2 are jointly electrically connected to a mediate node Ncrm'. The signals at the mediate nodes Ncrm, Ncrm' are defined as mediate signals Scrm, Scrm', respectively. Both the input and the output of the replica inverter inv_rpl are jointly electrically connected to a bias node Nbs. That is, the replica inverter inv_rpl is self-biased.

The capacitors C1, C2 respectively filter out the DC components of the corrector input signals Scri, Scri'. The replica inverter inv_rpl generates a bias signal Sbs at the bias node Nbs. The resistances of the resistors r1, r2 are designed to be equivalent, and the bias signal Sbs is equivalent to an average of the mediate signals Scrm, Srm', that is, an equilibrium value. Being maintained at the equilibrium value, the bias signal Sbs indirectly affect the mediate signals Scrm, Scrm' through the resistors r1, r2, respectively. Thus, at the mediate node Ncrm, the AC component of the differential converted signal Scnv1 can be indirectly affected by the bias signal Sbs through the resistor r1. Similarly, at the mediate node Ncrm', the AC component of the differential converted signal Scnv2 can be indirectly affected by the bias signal Sbs through the resistor r2.

Alternatively speaking, the mediate signals Scrm, Scrm' interact with each other through the resistors r1, r2, and a mutually restrained relationship is formed. In consequence, the duty-cycles of the mediate signals Scrm, Scrm' will be equivalent to 50%, so as the duty-cycles of the cycle-corrected output signals Scro, Scro'.

In an ideal case, the resistances of the resistors r1, r2 are equivalent. Whereas, even if the resistances of resistors r1, r2 are not equivalent, the duty-cycles of the cycle-corrected output signals Scro, Scro' will not be affected. In other words, as the resistors r1, r2 are not placed in the upper/lower signal paths, mismatch of the resistors r1, r2 does not affect the delay of the upper signal path and the lower signal path.

Figure 8:
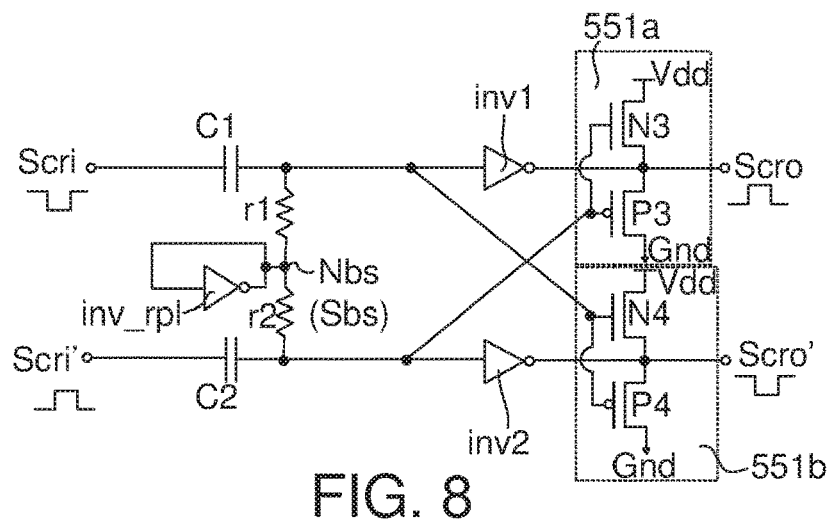
FIG. 8 is a schematic diagram illustrating the duty-cycle corrector equipped with a skew-calibration circuit.

FIG. 8 is a schematic diagram illustrating the duty-cycle corrector equipped with a skew-calibration circuit. Comparing with FIG. 7, the duty-cycle corrector 55 further includes skew-calibration buffers 551a, 551b, both are implemented with an NMOS-PMOS pair. The skew-calibration buffer 551a includes an NMOS transistor N3 and a PMOS transistor P3, and the skew-calibration buffer 551b includes an NMOS transistor N4 and a PMOS transistor P4. In FIG. 8, the combination of the corrector inverters inv1, inv2, and the skew-calibration buffers 551a, 551b functions like a skew-calibration circuit. Therefore, no skew distortion is introduced to the cycle-corrected output signals Scro, Scro'. Practical implementation of the skew-calibration buffers should not be limited to the ones shown in FIG. 8.

Figure 9:
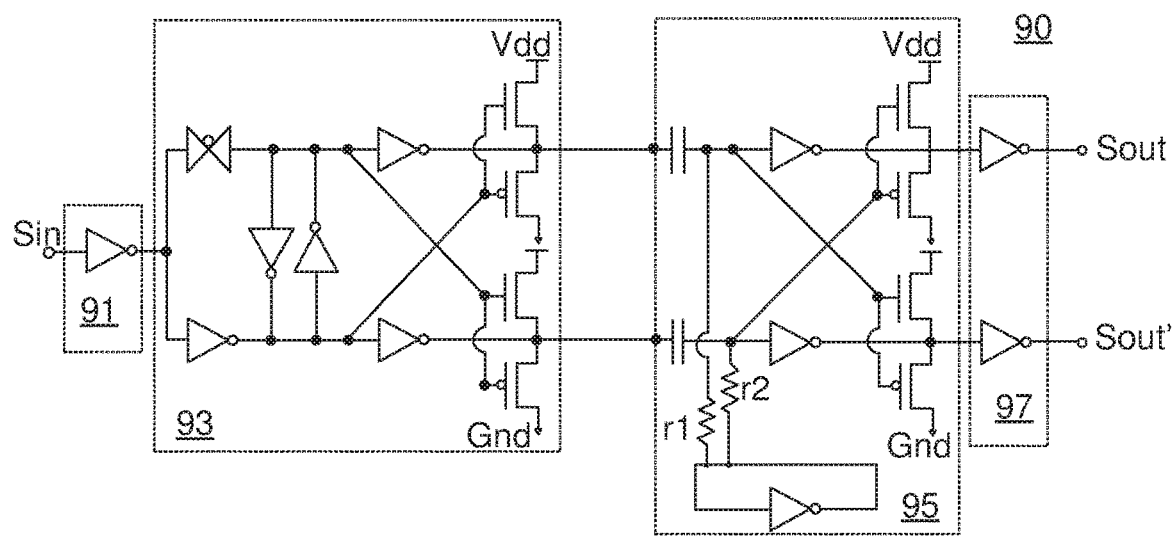
FIG. 9 is a schematic diagram illustrating the design of the differential clock generator according to the embodiment of the present disclosure.

FIG. 9 is a schematic diagram illustrating the design of the differential clock generator according to the embodiment of the present disclosure. The differential clock generator 90 includes an input buffer/inverter 91, a signal converter 93, a duty-cycle corrector 95, and an output buffer/inverter 97. Design of the input buffer/inverter 91, the signal converter 93, the duty-cycle corrector 95, and the output buffer/inverter 97 are not redundantly repeated. On some occasions, the differential clock generator 90 may further include a driving circuit.

Figure 10:
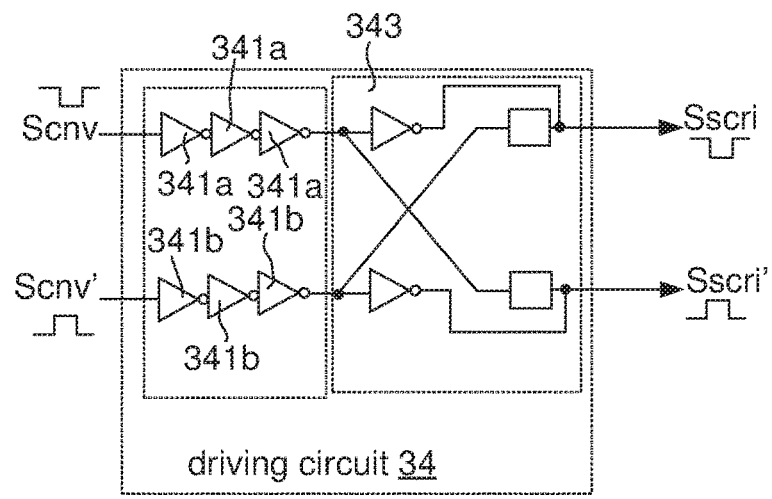
FIG. 10 is a schematic diagram illustrating an exemplary implementation of the driving circuit.

FIG. 10 is a schematic diagram illustrating an exemplary implementation of the driving circuit. At the upper signal path, the differential converted signal Scnv is received and the corrector input signal Scri is generated. At the lower signal path, the differential converted signal Scnv' is received, and the corrector input signal Scri' is generated.

The driving circuit 34 includes two inverter strings. The upper inverter string includes inverters 341*a*, and the lower inverter string includes inverters 341*b*. The number of the inverters 341*a* in the upper inverter string is equivalent to the number of the inverters 341*b* in the lower inverter string. For the sake of illustration, the upper inverter string is assumed to be an in-phase path, and the lower inverter string is assumed to be an out-of-phase path. However, in practical application, the actual numbers of the inverters 341*a*, 341*b* may affect the phases of the corrector input signals Scri, Scri'. To avoid the potential skew caused by the inverters 341*a*, 341*b*, the skew-calibration circuit 343 is provided. Details about the calibration circuit 343 are omitted.

In conclusion, the proposed differential clock generator can minimize the skew and the duty-cycle distortion of the differential converted signals Scnv, Scnv'. The signal converter has a skew-calibration circuit to ensure edges of differential converted signals Scnv1, Scnv2 are aligned. Then, the use of the replica inverter inv_rpl and the resistors r1, r2 in the duty-cycle corrector helps to maintain the duty-cycle of the output clock signals Sout, Sout' as 50%. As the operations of the signal converter and the duty-cycle corrector can dynamically change with the characteristics of the input signal, the design of the differential clock generator is PVT resistant.

In the specification, the phase skew and the duty-cycle distortion issues are concerned. According to the embodiment of the present disclosure, the output clock signals Sout, Sout' generated by the differential clock generator no longer have the skew and the duty-cycle distortion. Thus, the proposed differential clock generator is suitable for the SerDes transmitters and receivers operating at very high frequencies.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A duty-cycle corrector, comprising:
   a first input node, configured to receive a first corrector input signal;
   a second input node, configured to receive a second corrector input signal;
   a first output node, configured to output a first cycle-corrected output signal;
   a second output node, configured to output a second cycle-corrected output signal;
   an upper signal path, comprising:
      a first capacitor, electrically connected to the first input node and a first mediate node, configured to filter a DC component of the first corrector input signal and generate a first mediate signal at the first mediate node; and
      a first corrector inverter, electrically connected to the first mediate node and the first output node, configured to invert the first mediate signal to generate the first cycle-corrected output signal;
   a lower signal path, comprising:
      a second capacitor, electrically connected to the second input node and a second mediate node, configured to filter a DC component of the second corrector input signal and generate a second mediate signal at the second mediate node; and
      a second corrector inverter, electrically connected to the second mediate node and the second output node, configured to invert the second mediate signal to generate the second cycle-corrected output signal;
   a first resistor, electrically connected to the first mediate node and a bias node;
   a second resistor, electrically connected to the second mediate node and the bias node; and
   a replica inverter, electrically connected to the bias node, configured to generate a bias signal at the bias node, wherein the bias signal is related to the first mediate signal and the second mediate signal.

2. The duty-cycle corrector according to claim 1, wherein resistances of the first resistor and the second resistor are equivalent, and signal at the bias node is equivalent to an average of the first mediate signal and the second mediate signal.

3. The duty-cycle corrector according to claim 1, further comprising:
   a first calibration buffer, electrically connected to the second mediate node and the first output node, configured to generate the first cycle-corrected output signal; and
   a second calibration buffer, electrically connected to the first mediate node and the second output node, configured to generate the second cycle-corrected output signal.

4. The duty-cycle corrector according to claim 3, wherein the first calibration buffer comprises:
   a first NMOS transistor, electrically connected to a supply voltage, the second capacitor, the second resistor, and the first output node, configured to receive the second mediate signal; and
   a first PMOS transistor, electrically connected to a ground voltage, the second capacitor, the second resistor, and the first output node, configured to receive the second mediate signal, wherein the first NMOS transistor and the first PMOS transistor jointly generate the first cycle-corrected output signal.

5. The duty-cycle corrector according to claim 4, wherein the second calibration buffer comprises:
   a second NMOS transistor, electrically connected to the supply voltage, the first capacitor, the first resistor, and the second output node, configured to receive the first mediate signal; and
   a second PMOS transistor, electrically connected to the ground voltage, the first capacitor, the first resistor, and the second output node, configured to receive the first mediate signal, wherein the second NMOS transistor and the second PMOS transistor jointly generate the second cycle-corrected output signal.

6. A differential clock generator, comprising:
a signal converter, configured to convert a single input signal to a first differential converted signal and a second differential converted signal, comprising:
   a transmission gate, configured to receive and delay the single input signal to generate a delayed input signal; and
   a preliminary inverter, configured to receive and invert the single input signal to generate an inverted input signal; and
a skew-calibration circuit, comprising:
   a first skew-calibration inverter, electrically connected to the transmission gate, configured to invert the delayed input signal;
   a first skew-calibration buffer, electrically connected to the preliminary inverter, configured to buff the inverted input signal, wherein the first skew-calibration inverter and the first skew-calibration buffer jointly generate the first differential converted signal;
   a second skew-calibration inverter, electrically connected to the preliminary inverter, configured to invert the inverted input signal; and
   a second skew-calibration buffer, electrically connected to the transmission gate, configured to buff the delayed input signal, wherein the second skew-calibration inverter and the second skew-calibration buffer jointly generate the second differential converted signal, and the first differential converted signal and the second differential converted signal are out of phase; and
a duty-cycle corrector, configured to receive the first differential converted signal and the second differential converted signal, comprising:
   an upper signal path, comprising:
      a first capacitor, electrically connected to the first skew-calibration buffer and a first mediate node, configured to filter a DC component of the first differential converted signal and generate a first mediate signal at the first mediate node; and
      a first corrector inverter, electrically connected to the first mediate node, configured to invert the first mediate signal to generate the first cycle-corrected output signal;
   a lower signal path, comprising:
      a second capacitor, electrically connected to the second skew-calibration buffer and a second mediate node, configured to filter a DC component of the second differential converted signal and generate a second mediate signal at the second mediate node; and
      a second corrector inverter, electrically connected to the second mediate node, configured to invert the second mediate signal to generate the second cycle-corrected output signal;
   a first resistor, electrically connected to the first mediate node and a bias node;
   a second resistor, electrically connected to the second mediate node and the bias node; and
   a replica inverter, electrically connected to the bias node, configured to generate a bias signal at the bias node, wherein the bias signal is related to the first mediate signal and the second mediate signal.

7. The differential clock generator according to claim 6, wherein
the first differential converted signal is respectively related to the delayed input signal and the inverted input signal through the first skew-calibration inverter and the first skew-calibration buffer; and
the second differential converted signal is respectively related to the delayed input signal and the inverted input signal through the second skew-calibration buffer and the second skew-calibration inverter.

8. The differential clock generator according to claim 6, wherein
when the single input signal transits from a logic low to a logic high,
the delayed input signal and the second differential converted signal transit from the logic low to the logic high, and
the inverted input signal and the first differential converted signal transit from the logic high to the logic low.

9. The differential clock generator according to claim 6, wherein resistances of the first resistor and the second resistor are equivalent, and signal at the bias node is equivalent to an average of the first mediate signal and the second mediate signal.

10. The differential clock generator according to claim 6, further comprising:
a first calibration buffer, electrically connected to the second mediate node and the first corrector inverter, configured to generate the first cycle-corrected output signal; and
a second calibration buffer, electrically connected to the first mediate node and the second corrector inverter, configured to generate the second cycle-corrected output signal.

* * * * *